United States Patent
Bolken et al.

(10) Patent No.: US 8,508,034 B2
(45) Date of Patent: Aug. 13, 2013

(54) ELECTRONIC DEVICES

(75) Inventors: Todd O. Bolken, Star, ID (US); Cary J. Baerlocher, Meridian, ID (US); Steven W. Heppler, Boise, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/362,644

(22) Filed: Jan. 31, 2012

(65) Prior Publication Data

US 2012/0126386 A1    May 24, 2012

Related U.S. Application Data

(63) Continuation of application No. 12/579,187, filed on Oct. 14, 2009, now Pat. No. 8,115,296, which is a continuation of application No. 11/366,793, filed on Mar. 2, 2006, now abandoned, which is a continuation of application No. 11/180,493, filed on Jul. 13, 2005, now Pat. No. 7,026,548, which is a continuation of application No. 10/663,959, filed on Sep. 16, 2003, now Pat. No. 6,953,891.

(51) Int. Cl.
*H01L 23/48* (2006.01)
*H01L 23/52* (2006.01)

(52) U.S. Cl.
USPC .................................. 257/692; 257/E23.067

(58) Field of Classification Search
USPC .................... 257/692, E23.067, 680, E33.066
See application file for complete search history.

(56) References Cited

U.S. PATENT DOCUMENTS

| | | |
|---|---|---|
| 5,264,393 A | 11/1993 | Tamura et al. |
| 5,458,716 A | 10/1995 | Alfaro et al. |
| 5,692,296 A | 12/1997 | Variot |
| 5,811,799 A | 9/1998 | Wu |
| 5,865,935 A | 2/1999 | Ozimek et al. |
| 5,981,873 A | 11/1999 | Heo |
| 6,037,655 A | 3/2000 | Philbrick et al. |
| 6,072,232 A | 6/2000 | Li et al. |
| 6,130,448 A | 10/2000 | Bauer et al. |
| 6,147,389 A | 11/2000 | Stern et al. |
| 6,266,197 B1 | 7/2001 | Glenn et al. |
| 6,285,064 B1 | 9/2001 | Foster |
| 6,319,450 B1 | 11/2001 | Chua et al. |
| 6,372,553 B1 | 4/2002 | Briar |
| 6,483,030 B1 | 11/2002 | Glenn et al. |
| 6,486,562 B1 | 11/2002 | Kato |
| 6,531,321 B1 | 3/2003 | Ryan |
| 6,531,328 B1 | 3/2003 | Chen |

(Continued)

*Primary Examiner* — William D Coleman
(74) *Attorney, Agent, or Firm* — TraskBritt

(57) ABSTRACT

Various embodiments for molding tools for moisture-resistant image sensor packaging structures and methods of assembly are disclosed. Image sensor packages of the present invention include an interposer, a housing structure formed on the interposer for surrounding an image sensor chip, and a transparent cover. The housing structure may cover substantially all of the interposer chip surface. In another embodiment, the housing structure also covers substantially all of the interposer edge surfaces. The housing structure may also cover substantially all of the interposer attachment surface. An image sensor chip is electrically connected to the interposer with sealed wire bond connections or with sealed flip-chip connections. The housing structure may include runners that enable simultaneous sealing of the interior of the image sensor package and of the transparent cover.

20 Claims, 12 Drawing Sheets

(56) References Cited

U.S. PATENT DOCUMENTS

| | | |
|---|---|---|
| 6,746,894 B2 | 6/2004 | Fee et al. |
| 6,863,516 B2 | 3/2005 | Williams |
| 6,906,403 B2 | 6/2005 | Bolken et al. |
| 6,953,891 B2 | 10/2005 | Bolken et al. |
| 6,989,122 B1 | 1/2006 | Pham et al. |
| 7,026,548 B2 | 4/2006 | Bolken et al. |
| 2001/0024129 A1 | 9/2001 | Akram et al. |
| 2002/0167093 A1 | 11/2002 | Koike |
| 2004/0038442 A1 | 2/2004 | Kinsman |
| 2004/0211882 A1 | 10/2004 | Hsieh et al. |

ELECTRONIC DEVICES

CROSS-REFERENCE TO RELATED APPLICATIONS

This application is a continuation of U.S. patent application Ser. No. 12/579,187, filed Oct. 14, 2009, now U.S. Pat. No. 8,115,296, issued Feb. 14, 2012, which is a continuation of U.S. patent application Ser. No. 11/366,793, now abandoned, filed Mar. 2, 2006, which is a continuation of U.S. patent application Ser. No. 11/180,493, filed Jul. 13, 2005, now U.S. Pat. No. 7,026,548, issued Apr. 11, 2006, which is a continuation of U.S. patent application Ser. No. 10/663,959, filed Sep. 16, 2003, now U.S. Pat. No. 6,953,891, issued Oct. 11, 2005. The disclosure of each of the foregoing documents is hereby incorporated by reference in its entirety herein.

BACKGROUND OF THE INVENTION

1. Field of the Invention

The present invention relates generally to packaging of electronic devices for protection from external environmental conditions. More particularly, the present invention relates to moisture-resistant packages with transparent covers for enclosing solid-state image sensors or similar electronic devices that are sensitive to light or other forms of radiation.

2. State of the Art

Solid-state image sensors, for example, charge coupled devices (CCDs) or complementary metal-oxide semiconductor (CMOS) chips, are increasingly in demand for use with electronic products such as digital cameras. Conventionally, these sensors have been packaged for use by mounting them to a substrate and enclosing them within a housing assembly. The housing assembly incorporates a transparent lid to allow light or other forms of radiation to be received by the sensor. The lid may be a flat window or shaped as a lens to provide optical properties. The substrate and housing are often formed from a ceramic material, and the lid is glass or a similar transparent substance attached to the housing by an adhesive. Due to the materials and structure involved, this packaging technique may be expensive and difficult to manufacture.

In order to overcome these problems, various methods have been developed in attempts to simplify the construction of image sensor packages and reduce material costs. One such approach has been to fabricate packages by using molded housing assemblies that are attached to, or formed on, substrates of low-cost materials like BT/epoxy laminates or plastic. Examples include U.S. Pat. No. 5,811,799 to Wu and U.S. Pat. No. 6,266,197 to Glenn et al. U.S. Pat. No. 6,906,403, issued Jun. 14, 2005, and U.S. patent application Ser. No. 10/228,411, filed Aug. 26, 2002, now abandoned, both assigned to the assignee of the present invention, also disclose image sensor packages of this type.

While these and other designs have been beneficial with respect to reducing the cost of manufacturing, they raise other concerns. Image sensor packages constructed from materials such as those described above may not provide the same hermetic sealing capabilities as prior art ceramic packaging. Glass laminate-type substrates, for instance, are not completely impermeable and may absorb moisture, especially at edge locations where minute gaps between laminate layers are exposed to the outside environment. This moisture may ultimately find its way into the interior of the package, resulting in damage to the image sensor circuitry. Moisture absorption may also cause deformations in the substrate that will negatively affect the focal properties of the package. Another problem arises from the use of a molded housing, which does not have the high dimensional tolerances of ceramics and may cause difficulties with sealing to the substrate and transparent lid.

The increasing number of portable electronic products intended for use in extreme environments makes reliable sealing of image sensors an even more important aspect of any packaging structure. What is needed is an image sensor package that is simple and inexpensive to manufacture, and that also provides reliable hermetic sealing capabilities to prevent moisture damage and other harmful environmental effects.

BRIEF SUMMARY OF THE INVENTION

In accordance with the present invention, improved packages for electronic devices and methods for their assembly are disclosed. Embodiments of the present invention are directed to image sensor chips. However, packaging of any other light or radiation-sensitive electronic components is also contemplated as being within the scope of the present invention. In a basic form, an image sensor package according to the present invention comprises a housing structure formed on an interposer substrate by molding or other deposition process. The chips are mounted in a chip cavity formed by the housing structure and electrically connected to interposer contact pads that are exposed through the housing structure within the chip cavity. The chip cavity is then sealed by a transparent cover which acts as a window or lens. Once assembled, the image sensor package may be incorporated into electronic devices by connection to external attachment pads on the interposer. The packages are inexpensive and simple to construct while exhibiting durability and improved sealing properties.

In one embodiment according to the present invention, an image sensor package is assembled by forming a housing structure that covers substantially the entire chip surface of the interposer, leaving only a small area of the chip surface immediately surrounding the interposer contact pads exposed through apertures within the housing structure for connection to the image sensor chip. As used herein, the term "chip surface" refers to the side of the interposer on which image sensor chips are mounted within the chip cavity.

In another embodiment according to the present invention, the interposer may also include peripheral structures in the form of tie bars or other protrusions that extend from the edge surfaces of the interposer. The tie bars provide spacing to enable mold material to cover the edge surfaces of the interposer when forming the housing structure. The tie bars may also be used to connect a strip or array of interposers, thereby enabling multiple housing structures to be formed simultaneously on a single substrate and subsequently separated into individual image sensor packages.

In another embodiment according to the present invention, the housing structure also covers substantially the entire attachment surface of the interposer, leaving only the area of the attachment surface immediately surrounding the external attachment pads exposed. As used herein, the term "attachment surface" refers to the side of the interposer which is opposite the chip surface of the interposer.

In another embodiment according to the present invention, bond pads of the image sensor chip are attached directly to the interposer contact pads exposed through the apertures in the housing structure with wire bonds. The apertures may optionally be filled with a liquid sealant to further seal the interposer from the chip cavity.

In another embodiment according to the present invention, the apertures that expose the interposer contact pads are first filled with a conductive material up to a level that is substantially even with the bottom of the chip cavity. In this manner, the contact pads are built up to further seal the interposer from the chip cavity. Bond wires may then be attached to the built-up pads at a level that is substantially even with the bottom of the chip cavity, rather than in the relatively small space provided by the apertures in the housing structure exposing the contact pads. A liquid sealant may also be applied to further seal the connection between the built-up pads and the bond wires.

In an alternative to the above embodiment, the bond pads of the image sensor chip are attached directly to the built-up pads in a flip-chip manner, such that bond wires are not required. A liquid sealant may be applied under the image sensor chip in a capillary process to further seal the connection between the image sensor bond pads and the built-up pads.

In another embodiment according to the present invention, the housing structure is provided with runners that enable sealing the bottom of the chip cavity simultaneously with sealing the transparent cover to the housing structure. Under this embodiment, a ledge surrounding the chip cavity for supporting edges of the transparent cover acts as a runner for a sealant that fills the space between the edges of the transparent cover and the molded housing structure. At least one additional runner is formed by a channel that extends from the ledge down to the bottom surface of the chip cavity. After the transparent cover is placed on the ledge of the housing structure, a liquid sealant is injected into a sealing well formed in the housing structure adjacent to the runner areas. Capillary flow of the liquid sealant along the ledge fills the space between the edges of the transparent cover and the housing structure. At the same time, capillary flow of the liquid sealant along the additional runner or runners covers the bottom surface of the chip cavity to seal any exposed areas of the interposer.

Other and further features and advantages will be apparent from the following descriptions of the various embodiments of the present invention when read in conjunction with the accompanying drawings. It should be understood that the following descriptions are provided for illustrative and exemplary purposes only, and that numerous combinations of the elements of the various embodiments of the present invention are possible.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
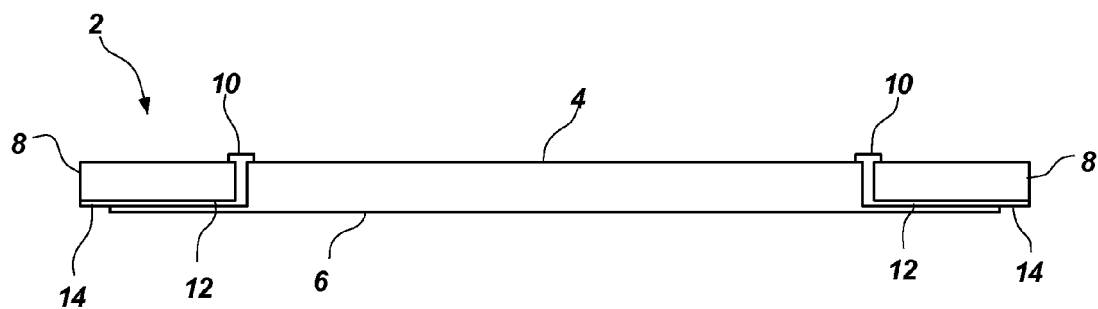
FIG. 1 is a cross-sectional side view of an image sensor package interposer according to the present invention.

As described below, the present invention includes package structures and methods of package assembly for image sensors such as solid state CCD or CMOS chips for receiving an image of reflected light or other electromagnetic radiation from one or more objects. However, the packages and methods of the present invention would also work well for enclosing other types of light or other radiation-sensitive electronic components such as, for example, erasable programmable read-only memory (EPROM) chips.

Referring initially to the accompanying drawings, various aspects of the present invention are illustrated to show exemplary image sensor package structures and methods for their assembly. To simplify the description of the present invention, common elements of the various embodiments illustrated by the drawings are designated with like reference numerals. The figures presented by the drawings are not meant to be illustrative of actual views of any particular portion of a particular image sensor package structure, but are merely idealized schematic representations which are employed to assist in clearly and fully describing the invention.

FIG. 1 shows an interposer 2 that is utilized as a platform for the subsequent formation of image sensor package embodiments of the present invention. Interposer 2 includes a chip surface 4, an opposing attachment surface 6, and peripheral edge surfaces 8. Contact pads 10 are formed on chip surface 4 for wire bond or flip-chip connection to an image sensor chip as described in further detail below. Internal conductive elements 12 electrically connect contact pads 10 to attachment pads 14 on attachment surface 6 for connecting a completed image sensor package to a larger assembly such as a printed circuit board. Interposer 2 may be formed of materials such as FR-4 and BT laminates or even plastic, which are less expensive and easier to manufacture than the ceramic substrates typically used for image sensor packages. Of course, any conventional substrate materials, including ceramic, may be used to form interposer 2 if necessary or desirable based on other considerations besides cost. While interposer 2 is illustrated as being configured for assembly of a single image sensor package, it may also be formed as part of a larger substrate comprising multiple interposers. In this manner, several image sensor packages can be formed simultaneously on a single substrate, which is then singulated to provide individual image sensor packages.

Figure 2A:
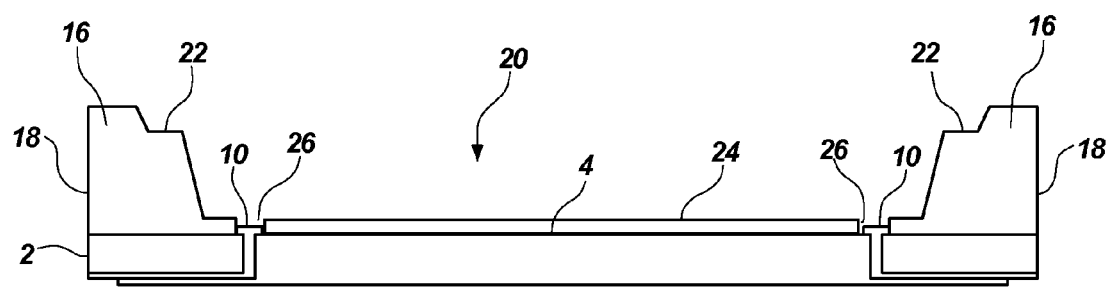
FIG. 2A is a cross-sectional side view of a first embodiment of a package structure according to the present invention.
Figure 2B:
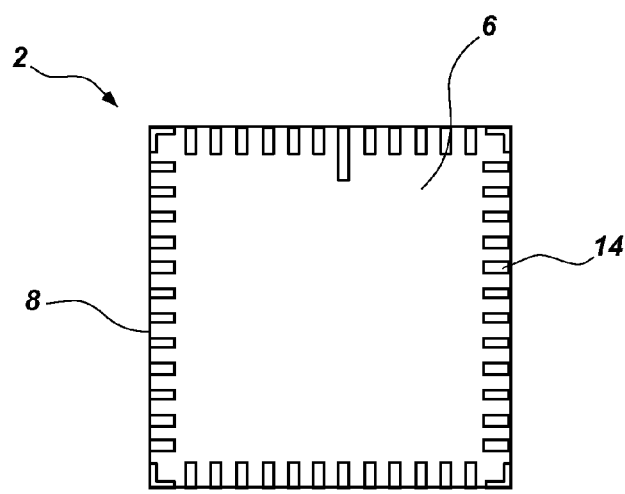
FIG. 2B is a bottom view of the package structure depicted in FIG. 2A.
Figure 2C:
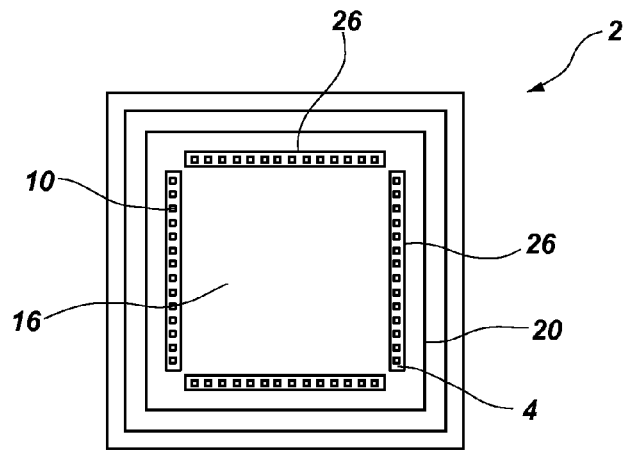
FIG. 2C is a top view of the package structure depicted in FIG. 2A.

Turning to FIGS. 2A-2C, a first embodiment of an image sensor package according to the present invention is illustrated. As seen in FIG. 2A, a housing structure 16 is formed on interposer 2 that covers substantially all of chip surface 4. Housing structure 16 has raised sidewalls 18 around the perimeter of interposer 2, thereby forming a chip cavity 20 for receiving an image sensor chip. Sidewalls 18 include a ledge 22 that surrounds chip cavity 20 for receiving and supporting a transparent cover 46 (FIG. 7C). Housing structure 16 also extends across the bottom surface 24 of chip cavity 20 and includes apertures 26 for exposing contact pads 10 of interposer 2.

FIG. 2B shows a bottom view of interposer 2 with attachment pads 14 positioned around the perimeter of attachment surface 6. It should be understood that the location and shape of attachment pads 14 illustrated in FIG. 2B are only exemplary, and that any other known pad layout is possible. Image sensor packages requiring a high number of I/O connections, for instance, may have a matrix of attachment pads formed in an array pattern on attachment surface 6. Rather than being rectangular, attachment pads 14 might also have a circular shape to receive ball or spherically shaped external conductive elements.

FIGS. 2A and 2B show that in the current embodiment, housing structure 16 does not cover attachment surface 6 or edge surfaces 8 of interposer 2, but is instead limited to covering chip surface 4 in the manner shown by FIG. 2C. As seen in FIG. 2C, the area of interposer 2 at the bottom of chip cavity 20 is entirely covered by housing structure 16 except for locations where apertures 26 are formed to expose contact pads 10. FIG. 2C illustrates that contact pads 10 are positioned in rows with a single aperture 26 exposing an entire row of contact pads 10. It is also possible that an aperture 26 may be provided for each contact pad 10, with material from housing structure 16 covering areas between adjacent contact pads 10.

Figure 3:
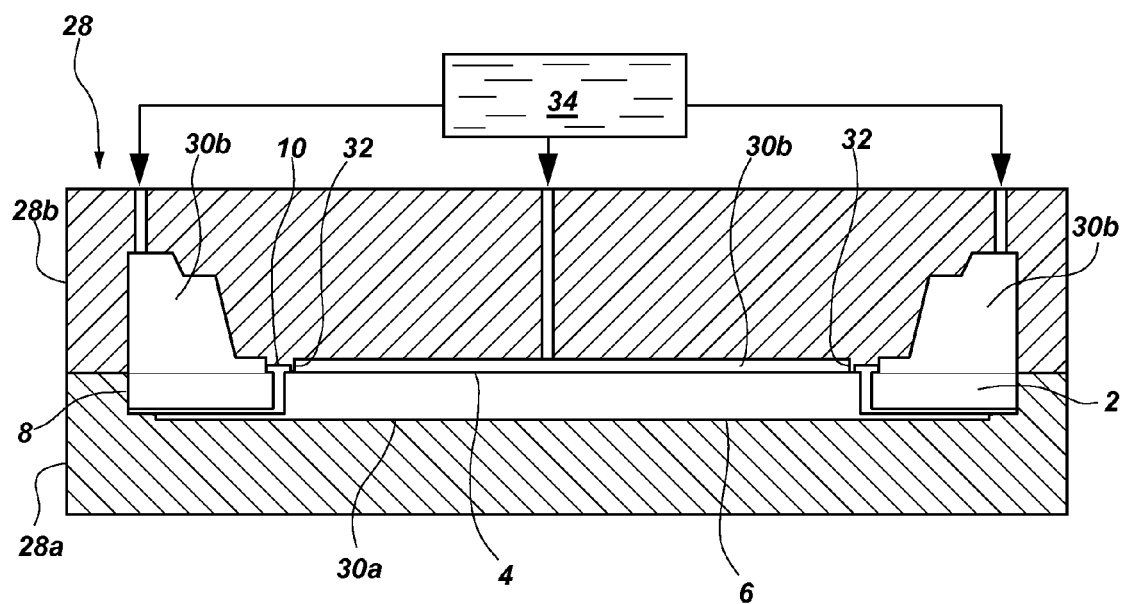
FIG. 3 shows a molding process for forming the package structure depicted in FIG. 2A.

Housing structure 16 may be formed on interposer 2 using conventional molding processes such as transfer molding, pot molding, or injection molding. FIG. 3 shows an example of how housing structure 16 may be formed by a molding process. A molding tool 28 is provided having a lower platen 28a and an upper platen 28b. Lower platen 28a includes a mold cavity 30a which holds interposer 2 in sealing relationship against attachment surface 6 and edge surfaces 8. Upper platen 28b includes a mold cavity 30b that is positioned over chip surface 4. As seen in FIG. 3, mold cavity 30b includes protrusions 32 that seal against contact pads 10 to form apertures 26 in housing structure 16. Mold cavity 30b is then filled with a mold compound 34 in a liquid or otherwise molten state. Mold compound 34 is cured to an at least semisolid state, and interposer 2 is removed from molding tool 28, leaving the housing structure 16 illustrated in FIGS. 2A-2C.

In the situation where interposer 2 is formed as part of a larger substrate containing multiple interposers, mold cavities 30a and 30b may be configured with a size and shape to form a housing structure onto the chip surface of each interposer, with subsequent singulation of the larger substrate providing individual image sensor packages. It is also possible that housing structure 16 could be premolded and then attached to interposer 2 with a layer of suitable adhesive material applied to one or both of chip surface 4 and housing structure 16.

Mold compound 34 may be a thermoplastic polymer or other suitable encapsulant material as known in the art. Further, a filler material such as fine silicon particles may be incorporated within the mold compound 34 to reduce cost, also as known in the art. Other suitable known materials for mold compounds include, without limitation, thermoset polymers and epoxy compounds. Any other molding compounds may be employed to form housing structure 16, however, it is desirable to use a material that exhibits low moisture absorption and a CTE (coefficient of thermal expansion) having a minimal difference from that of interposer 2 and transparent cover 46 (FIG. 7C).

Figure 4A:
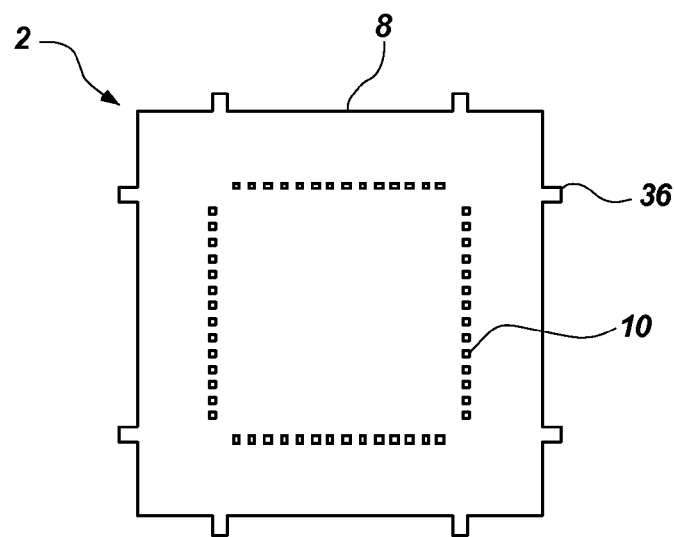
FIG. 4A is a top view of an image sensor package interposer according to a second embodiment of the present invention.
Figure 4B:
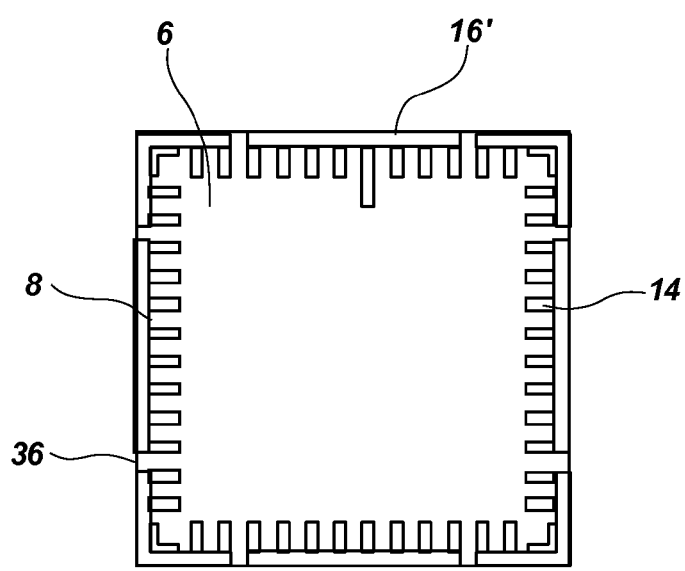
FIG. 4B is a bottom view of a package structure according to the second embodiment of the present invention.
Figure 4C:
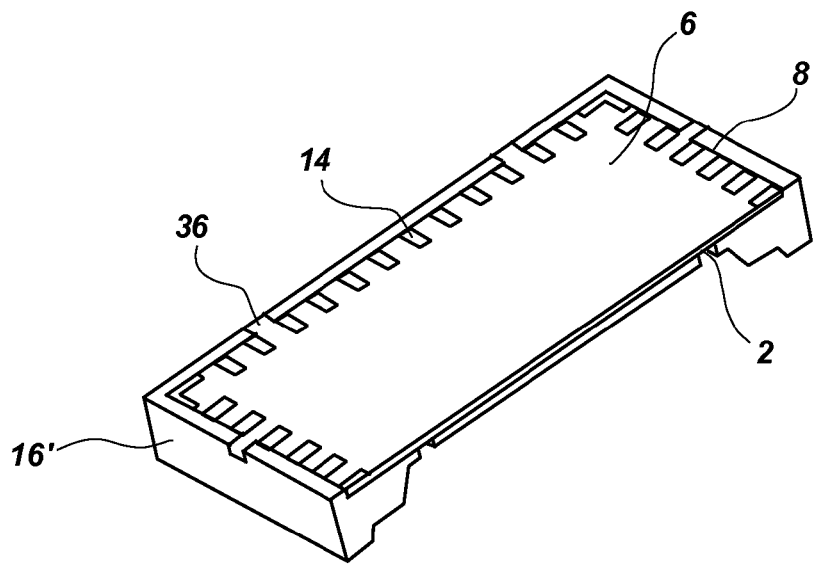
FIG. 4C is a bottom perspective view of the package structure depicted in FIG. 4B.

FIGS. 4A-4C show a second embodiment of an image sensor package according to the present invention. As seen in FIG. 4A, with the second embodiment, interposer 2 includes tie bars 36 that protrude from edge surfaces 8. Tie bars 36 provide spacing to enable mold compound 34 to cover edge surfaces 8 of interposer 2 during package formation. With the molding process illustrated in FIG. 3, for instance, tie bars 36 would abut against the sides of mold cavity 30a in lower platen 28a to center interposer 2 within mold cavity 30a. When mold cavity 30b is filled, mold compound 34 enters the areas between the sides of mold cavity 30a and edge surfaces 8 of interposer 2. After curing mold compound 34, interposer 2 is removed from molding tool 28, leaving a housing structure 16' that covers and seals chip surface 4 and all of edge surfaces 8 except for the outer ends of tie bars 36, as illustrated by FIGS. 4B and 4C.

The second image sensor package embodiment is well suited for situations where interposer 2 comprises a laminate-type substrate with minute gaps between laminate layers that are exposed to the outside environment and may absorb moisture. The second embodiment is also applicable where interposer 2 is formed as part of a larger substrate containing multiple interposers. For example, slots or openings may be formed in the larger substrate at locations between the interposer 2, leaving portions of substrate material between the interposers to act as tie bars 36. In this manner, tie bars 36 hold the interposers together while enabling mold compound 34 to cover edge surfaces 8 of all the interposers. Once package formation is complete, the cured molding compound 34 and tie bars 36 between adjacent interposers 2 are cut or otherwise separated to provide individual image sensor packages.

Figure 5:
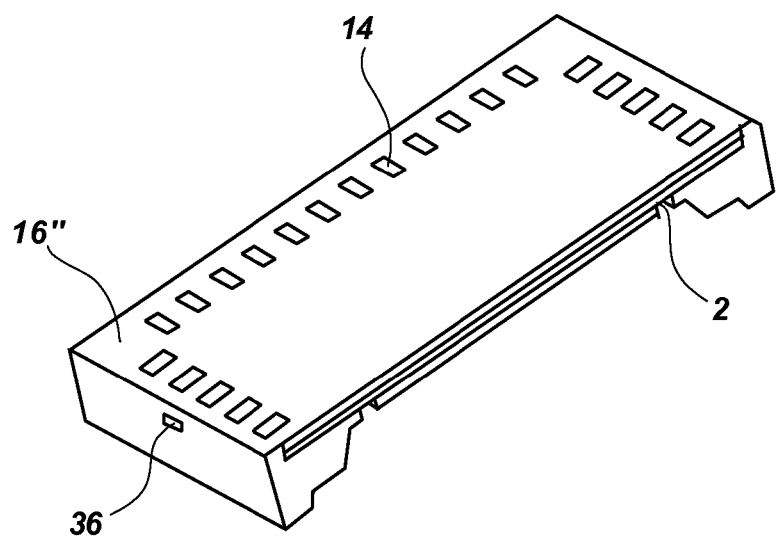
FIG. 5 is a bottom perspective view of a package structure according to a third embodiment of the present invention.

In some instances, it may be desirable to seal all of the surfaces of interposer 2 from the outside environment. Such sealing not only helps prevent moisture from entering chip cavity 20, but also further limits any moisture that may be absorbed by interposer 2. Moisture absorption by interposer 2 is a concern as it may cause warping or other deformations in shape that will negatively affect the focal properties of a completed image sensor package. FIG. 5 shows a third embodiment of an image sensor package according to the present invention that addresses this problem. As seen in FIG. 5, with the third embodiment, a housing structure 16" is formed on interposer 2 that covers substantially all of chip surface 4 and edge surfaces 8, and also covers substantially the entire attachment surface 6 of the interposer 2, leaving only the external attachment pads 14 exposed.

Figure 6:
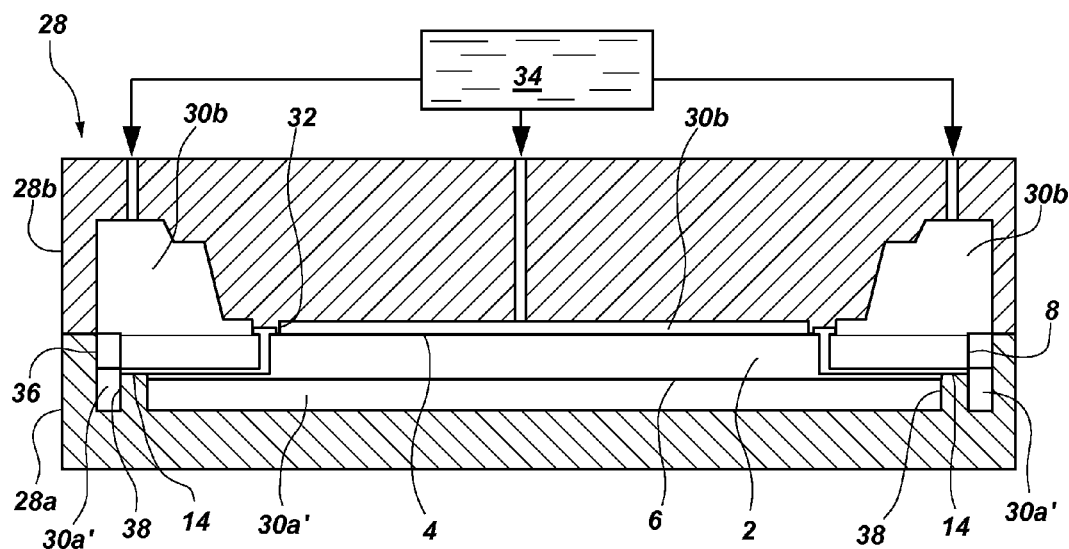
FIG. 6 shows a molding process for forming the package structure depicted in FIG. 5.

FIG. 6 shows an exemplary molding process for forming housing structure 16". According to the third embodiment, molding tool 28 is modified such that lower platen 28a has a mold cavity 30a' that does not seal against attachment surface 6 of interposer 2. Instead, mold cavity 30a' includes protrusions 38 that raise interposer 2 up from the bottom of mold cavity 30a' and seal against attachment pads 14. As in the second embodiment, interposer 2 has tie bars 36 that abut against the sides of mold cavity 30a' in lower platen 28a to center interposer 2 within mold cavity 30a'. When mold cavity 30b is filled, mold compound 34 passes through the areas between the sides of mold cavity 30a' and edge surfaces 8 of interposer 2, thereby filling the bottom of mold cavity 30a' and covering attachment surface 6. After curing mold compound 34, interposer 2 is removed from molding tool 28, leaving housing structure 16" that covers and seals substantially all of chip surface 4, edge surfaces 8, and attachment surface 6 as illustrated by FIG. 5.

Where interposer 2 is formed as part of a larger substrate containing multiple interposers, tie bars 36 may be formed in the same manner as described in the second embodiment and used to hold the interposers together during the molding process. The spaces between each interposer provide additional areas for mold compound 34 to pass into mold cavity 30a' in order to cover attachment surface 6. When mold cavities 30a' and 30b are configured with a size and shape for molding large substrates containing multiple interposers, it may also be desirable to supply mold compound 34 directly to mold cavity 30a' while filling mold cavity 30b to ensure uniform coverage.

It will be understood by one of ordinary skill in the art that the molding processes described with respect to the above embodiments are only exemplary, and that other methods may be used to apply mold material to the various surfaces of interposer 2.

Other alternatives to forming housing structures 16-16" are also contemplated by the present invention. One such alternative includes disposing a flowable material over the surfaces of interposer 2 in one or more sequentially cured layers to build housing structures 16-16". To form housing structure 16, for example, a high-viscosity liquid or gel such as an epoxy may be dispensed from a nozzle onto chip surface 4. The high-viscosity liquid or gel is then cured to form a first hardened layer. An additional layer of high-viscosity liquid or gel is dispensed over the first hardened layer and cured to form second hardened layer. Subsequent layers of liquid or gel may be added, as necessary, until the desired shape for housing structure 16 is formed. To form housing structure 16', the liquid or gel may simply be deposited in layers along edge surfaces 8 while covering chip surface 4. With this method, tie bars 36 are not required to provide mold spacing, and edge surfaces 8 may be completely sealed from the outside environment. Once chip surface 4 and edge surfaces 8 are covered, the same process may be used to cover attachment surface 6, thereby forming housing structure 16".

Another example of this layering approach exists in using a stereolithographic (STL) deposition process to form housing structures 16-16". As defined in the art, STL involves the formation of solid structures by selectively curing portions of volumes of a photocurable liquid polymer or resin material contained within a tank or reservoir. Depending on the liquid material composition, curing may be accomplished by exposure to irradiation with selected wavelengths of light or other electromagnetic radiation, for instance, when curing a material susceptible to initiation of cross-linking by exposure to ultraviolet (UV) radiation, such as through use of a UV laser beam. By curing one or more successive layers of the liquid material, intricate solid structures of almost any shape may be formed.

After a housing structure 16-16" has been formed on interposer 2, an image sensor chip may be mounted within chip cavity 20. FIGS. 7A-9B show alternative embodiments of how an image sensor chip may be mounted within chip cavity 20 and electrically connected to contact pads 10 of interposer 2. While the following embodiments are described in terms of housing structure 16, it should be understood that they also apply to mounting of image sensor chips within housing structures 16' and 16".

Figure 7A:
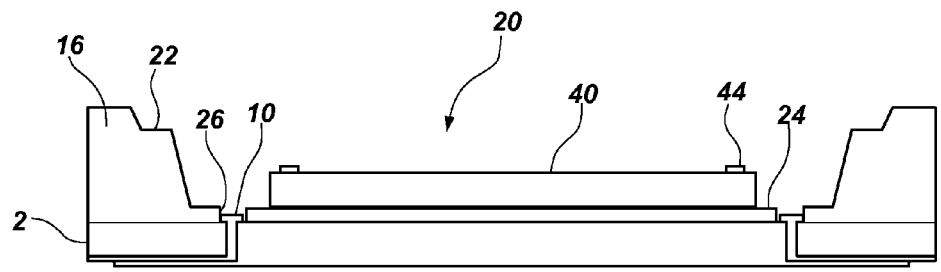
FIG. 7A is a cross-sectional side view of a package structure according to a fourth embodiment of the present invention.
Figure 7B:
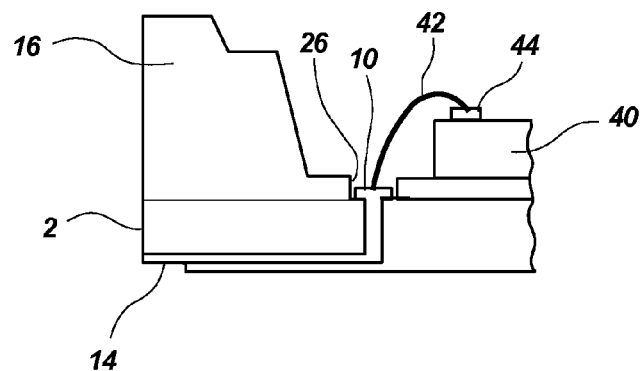
FIG. 7B is an enlarged sectional view of the package structure depicted in FIG. 7A.
Figure 7C:
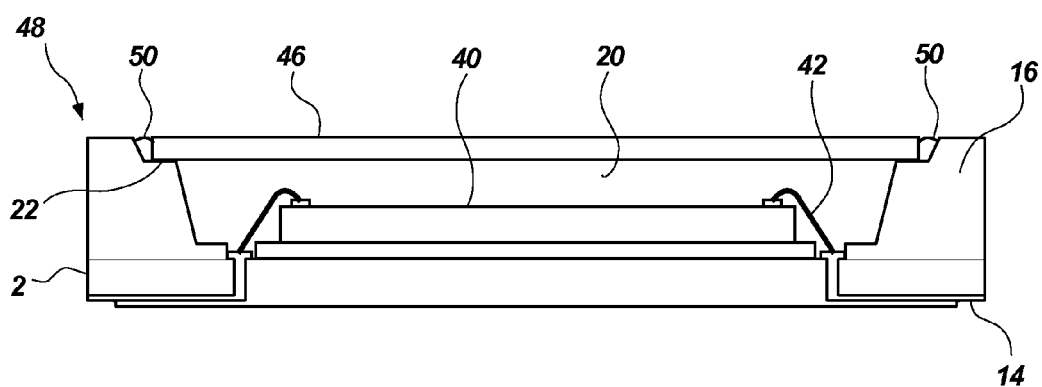
FIG. 7C is a cross-sectional side view of an image sensor package according to the fourth embodiment of the present invention.

FIGS. 7A-7D show a fourth embodiment of an image sensor package according to the present invention wherein an image sensor chip 40 is wire bonded directly to contact pads 10 exposed through apertures 26 of housing structure 16. As seen in FIG. 7A, image sensor chip 40 is attached to the bottom surface 24 of chip cavity 20 between opposing rows of contact pads 10. Attachment of image sensor chip 40 may be accomplished with an adhesive material (not shown) applied to one or both of bottom surface 24 and image sensor chip 40. FIG. 7B shows that once image sensor chip 40 is in place, bond wires 42 are attached between contact pads 10 of interposer 2 and bond pads 44 of image sensor chip 40 to provide electrical connection.

At this point, a transparent cover 46 may be set onto ledge 22 of housing structure 16 and sealed in place to provide a completed image sensor package 48, as illustrated by FIG. 7C. Transparent cover 46 may be formed of an at least partially optically transparent material such as borosilicate glass (BSG). Of course, other types of glass, quartz or even plastic which enable the passage of a desired range of wavelengths of light or other forms of electromagnetic radiation may also be used. Furthermore, transparent cover 46 may be formed to provide an optical function, for example, shaping its surface at locations above chip cavity 20 to provide focusing capabilities.

To secure transparent cover 46 in place and hermetically seal image sensor chip 40 within chip cavity 20, a bead of epoxy, silicone gel or other liquid or gel adhesive sealant 50 may be applied along the edge of transparent cover 46 as shown in FIG. 7C. If desired, a two-component adhesive resin may be employed, with one component applied to ledge 22 and the other to transparent cover 46 so that a cure will not commence until the two components are in contact. Other known sealing mechanisms may be used as well, as long as they provide a suitable hermetic bond. It is desirable, so that the optical capabilities of image sensor chip 40 are not compromised, that any adhesive used be of a type which does not outgas volatiles or other compounds when curing. A snap-cure epoxy, as known in the art, may be suitable, as may an epoxy cured to a B-stage, or tacky state, prior to application of transparent cover 46. Another possibility is to form housing structure 16 with a runner that provides a space for venting gases from chip cavity 20 while adhesive sealant 50 cures, as described in further detail below.

Figure 7D:
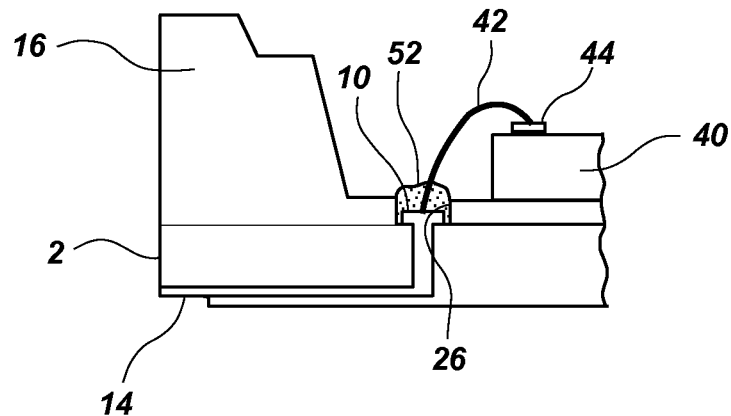
FIG. 7D is an enlarged sectional view of the packaged structure depicted in FIG. 7A including an optional sealant.

With the fourth embodiment of the present invention, it may sometimes be desirable to completely seal the bottom surface 24 of chip cavity 20 by filling in apertures 26 prior to attaching transparent cover 46. FIG. 7D shows that liquid sealant 52 is deposited within apertures 26 to accomplish this complete sealing. Liquid sealant 52 may be any material that exhibits low moisture permeability and bonds well to the surrounding housing structure 16. Conventional UV or thermally cured epoxy adhesives, for example, may be suitable for this application.

Figure 8A:
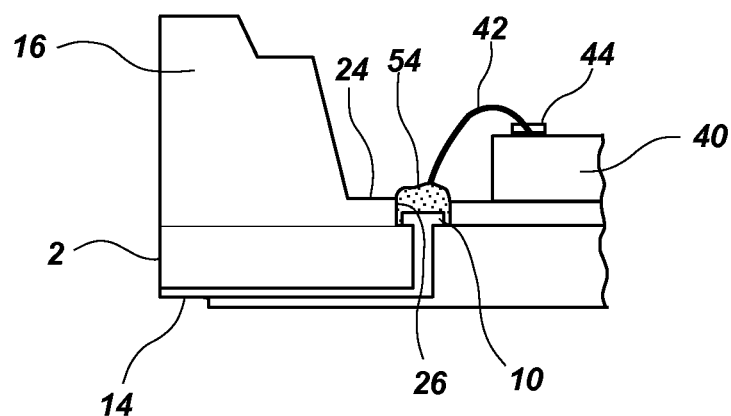
FIG. 8A shows an enlarged sectional view of a package structure according to a fifth embodiment of the present invention.
Figure 8B:
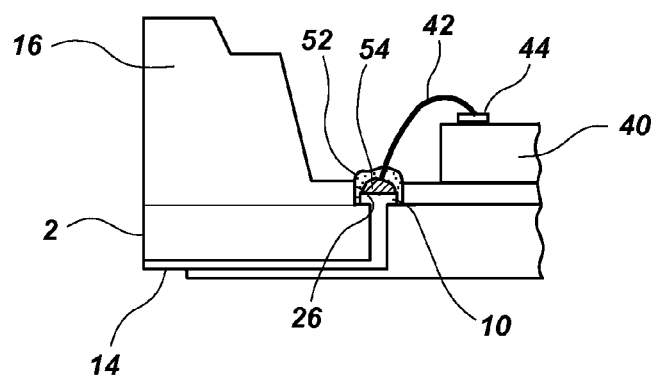
FIG. 8B shows an enlarged sectional view of an alternative package structure according to the fifth embodiment of the present invention.

FIG. 8A shows a fifth embodiment of an image sensor package according to the present invention where apertures 26 are first filled with a conductive material 54 up to a level that is substantially even with the bottom surface 24 of the chip cavity 20. In this manner, contact pads 10 are built up to further seal interposer 2 from chip cavity 20. Furthermore, bond wires 42 may then be attached to conductive material 54 at a level that is substantially even with bottom surface 24, eliminating the difficulties with having to attach a bond wire 42 within the relatively small space provided by apertures 26. Filling of apertures 26 may be carried out with conventional metal deposition processes such as chemical-vapor deposition (CVD), depositing a conductive or conductor-filled epoxy, or simply by depositing and reflowing solder paste within apertures 26. FIG. 8B shows that in the case where conductive material 54 is a solder paste, it may not completely fill apertures 26 because flux material is driven off during reflow. In this situation, liquid sealant 52 may be deposited over conductive material 54 to completely fill apertures 26.

Figure 9A:
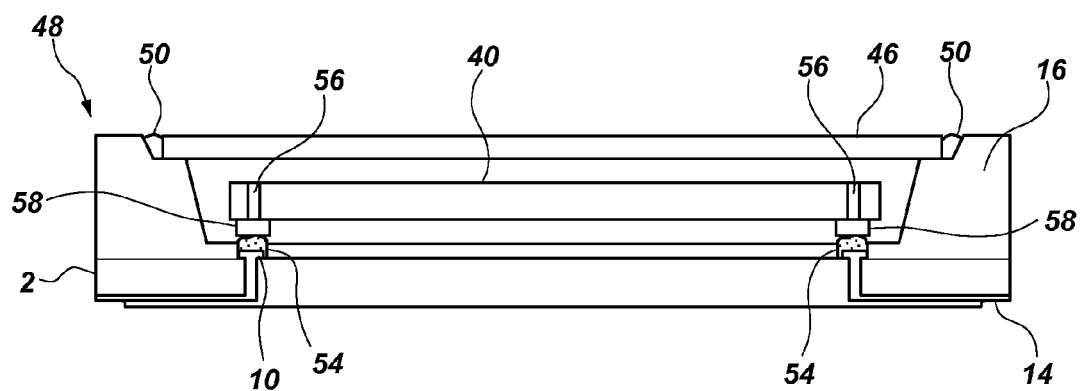
FIG. 9A is a cross-sectional side view of a flip-chip-configured image sensor package according to the fifth embodiment of the present invention.
Figure 9B:
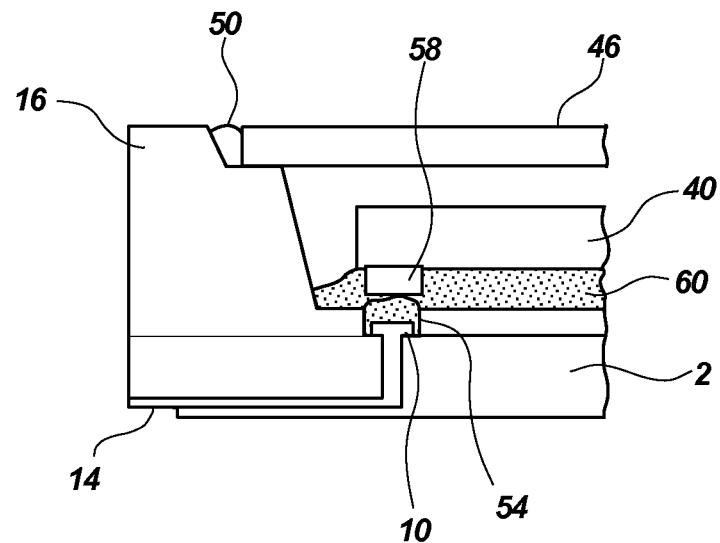
FIG. 9B is an enlarged sectional view of the image sensor package depicted in FIG. 9A.

FIGS. 9A and 9B show an alternative to the fifth embodiment of the present invention wherein image sensor chip 40 is attached directly to the built-up conductive material 54 over contact pads 10 in a flip-chip manner, such that bond wires 42 are not required. As seen in FIG. 9A, image sensor chip 40 includes through-hole vias 56 connected to bottom-side bond pads 58 on image sensor chip 40. The formation of through-hole vias 56 may be accomplished by laser cutting or etching holes in image sensor chip 40 and filling the holes with conductive material. Such via formation processes are known in the art and need not be described further with respect to carrying out the present invention. By using a flip-chip configuration, it is possible to mount a larger image sensor chip 40 within chip cavity 20 because contact pads 10 of interposer 2 may be located underneath, rather than peripheral to, image sensor chip 40. Furthermore, contact pads 10 may be positioned in an array-type pad layout across the entire bottom surface 24 of chip cavity 20, enabling image sensor chips having higher I/O requirements to be mounted within the same area.

Image sensor chip 40 is secured within chip cavity 20 by attaching bottom-side bond pads 58 to conductive material 54 with a conductive bond. A conductive adhesive material may be used for this purpose, such as conductive or conductor-filled epoxies, or with a film of anisotropically conductive adhesive material that is applied to cover all of the bonding areas. Alternatively, if epoxy or solder paste is used for conductive material 54, bottom-side bond pads 58 may simply be set in place and bonded to by curing the epoxy or reflowing the solder paste. FIG. 9B shows that the flip-chip mounting embodiment may optionally include deposition of an underfill 60 by capillary flow of a liquid sealing material to fill gaps between bottom surface 24 of chip cavity 20 and image sensor chip 40. As known in the art, underfill 60 reinforces the conductive bonds to image sensor chip 40 and seals out contamination that may cause shorting between bond locations.

In a sixth embodiment according to the present invention, any of housing structures 16-16″ may be provided with one or more runners that enable sealing the bottom surface 24 of chip cavity 20 simultaneously with the sealing of transparent cover 46. FIGS. 10-13 show an example of this embodiment of the invention. While FIGS. 10-13 are described in teens of housing structure 16, it should be understood that the present embodiment is also applicable to housing structures 16′ and 16″.

Figure 10:
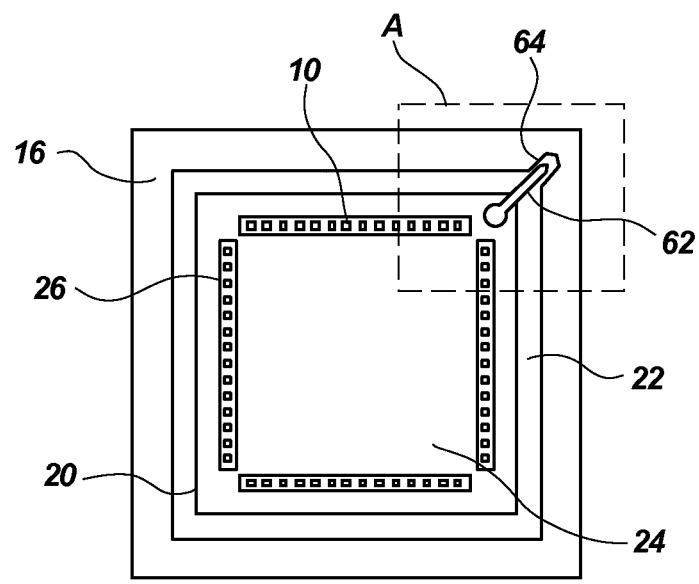
FIG. 10 is a top view of a package structure according to a sixth embodiment of the present invention.
Figure 11:
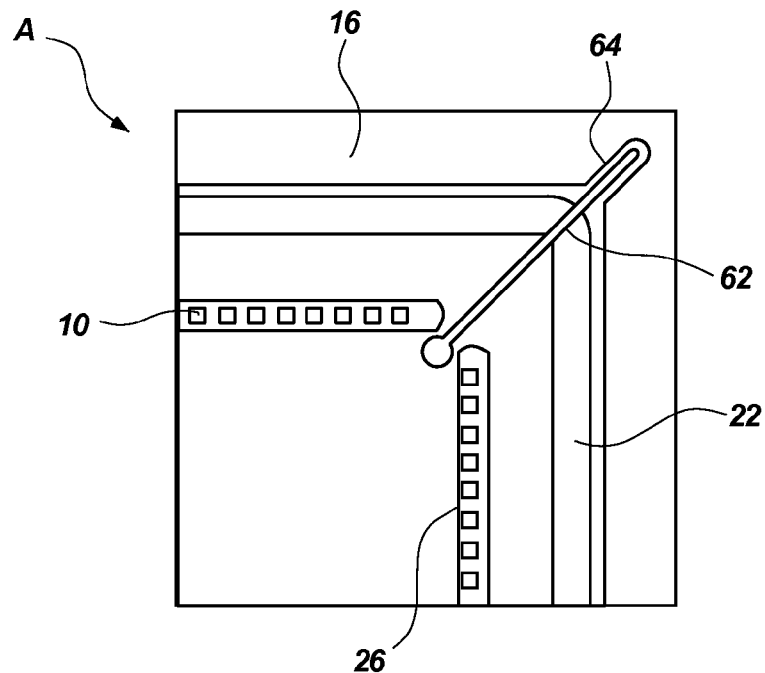
FIG. 11 is an enlarged sectional view showing a channel formed in the package structure depicted in FIG. 10.

In the same manner as previously discussed, FIG. 10 shows that housing structure 16 is formed with a ledge 22 surrounding chip cavity 20 for supporting the edges of transparent cover 46 (not shown). Ledge 22 acts as a runner for adhesive sealant 50 to fill the space between the edges of transparent cover 46 and housing structure 16. In the present embodiment, adhesive sealant 50 comprises a liquid epoxy. However, other curable liquid sealants suitable for deposition by capillary flow may also be used, as long as they are capable of forming a hermetic seal. At least one additional runner is formed by a channel 62 that extends from ledge 22 down to bottom surface 24 of chip cavity 20. FIG. 11 is an enlarged view of area A in FIG. 10 that more clearly shows channel 62 formed to extend down a corner of chip cavity 20. FIG. 11 also shows that a sealing well 64 is formed in housing structure 16 to provide an expanded opening adjacent to the junction of channel 62 and ledge 22.

Figure 12A:
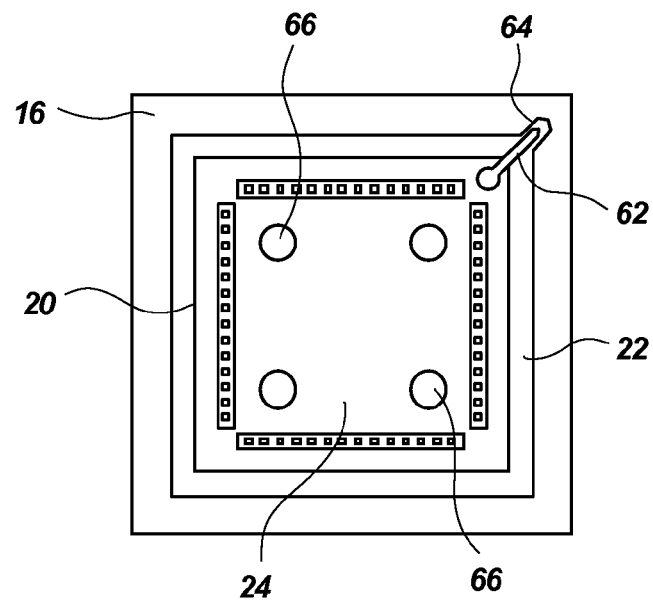
FIGS. 12A-12D and 13 show a process for assembling and sealing an image sensor package according to the sixth embodiment of the present invention.
Figure 12B:
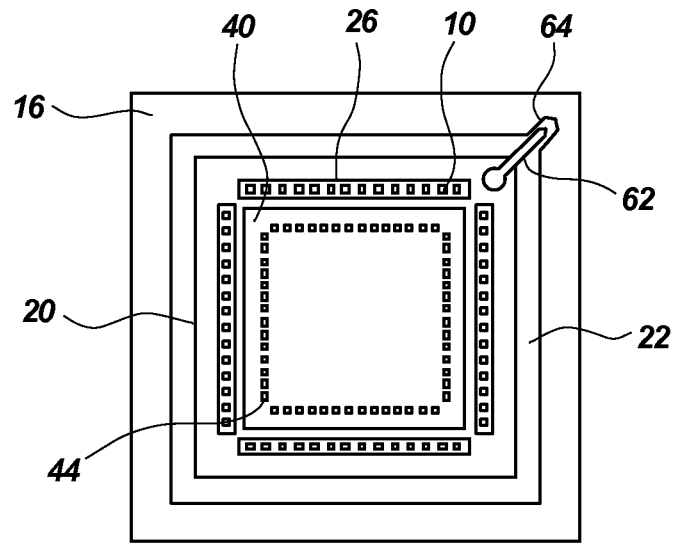
Figure 12C:
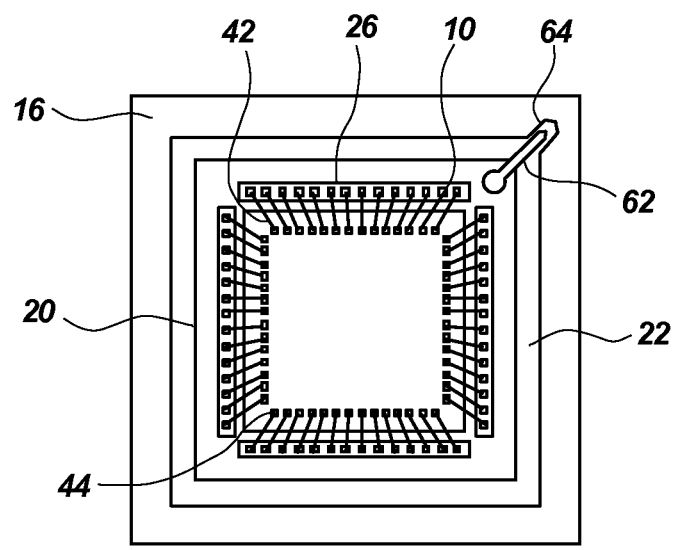
Figure 12D:
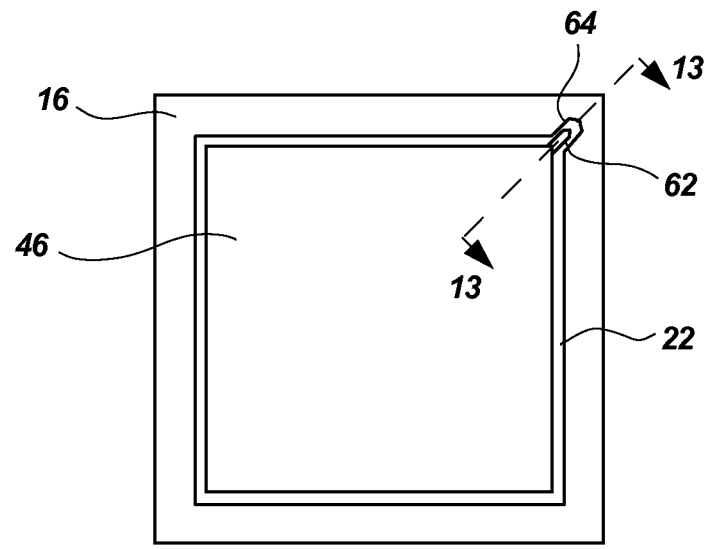
Figure 13:
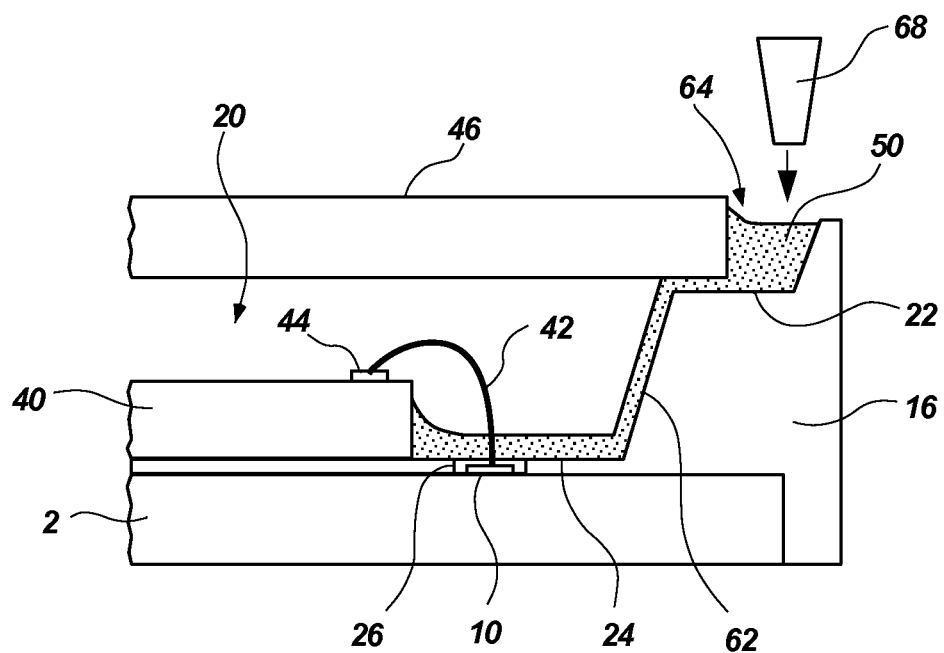

Turning to FIGS. 12A-13, an exemplary assembly process is illustrated to show how the present embodiment enables simultaneous sealing of bottom surface 24 and transparent cover 46. In FIG. 12A, an epoxy 66 or other suitable adhesive material is deposited on bottom surface 24. In FIG. 12B, image sensor chip 40 is mounted within chip cavity 20 by attachment to epoxy 66. Once epoxy 66 has sufficiently cured, bond pads 44 on the top of image sensor chip 40 are electrically connected to contact pads 10 with bond wires 42, as shown in FIG. 12C. In FIG. 12D transparent cover 46 is placed on ledge 22 of housing structure 16. As shown by FIG. 12D, sealing well 64 provides an opening at the corner of transparent cover 46 through which adhesive sealant 50 may be injected into the runner areas formed by ledge 22 and channel 62.

FIG. 13 is a sectional view of image sensor package 48 taken along line 13-13 in FIG. 12D. FIG. 13 shows that after transparent cover 46 is placed on ledge 22, adhesive sealant 50 is dispensed from a nozzle 68 into sealing well 64, and by capillary action flows around the runner area of ledge 22 to fill the space between housing structure 16 and transparent cover 46. At the same time, capillary flow of adhesive sealant 50 down channel 62 covers and further seals bottom surface 24 of chip cavity 20. In this manner, adhesive sealant 50 may be used to fill apertures 26, eliminating the need to perform a separate filling operation with liquid sealant 52 as described above with respect to the fourth and fifth embodiments of the present invention.

In order to encourage the capillary flow of adhesive sealant 50, it may be necessary in some situations to carry out the dispensing operation under a vacuum applied to chip cavity 20. Once adhesive sealant 50 has been dispensed to a desired level, the opening provided by sealing well 64 may be filled to completely seal chip cavity 20 from the outside environment. An additional benefit of this process is that while sealing well 64 remains unfilled, volatiles or other compounds produced by the curing of adhesive sealant 50 within chip cavity 20 may be outgassed through the remaining opening.

Although FIGS. 12A-13 show sealing for an image sensor package with a wire-bonded configuration, this sealing structure and method may also be used for the flip-chip mounted image sensor chip 40 illustrated in FIGS. 9A and 9B. In a flip-chip configuration, the capillary flow of adhesive sealant 50 fills the spaces between image sensor chip 40 and bottom surface 24 of chip cavity 20, eliminating the need to perform a separate operation for forming underfill 60. It should also be understood that while FIGS. 12A-13 depict a single channel 62 formed along a corner of chip cavity 20, other configurations are possible. Channel 62 and sealing well 64 may be formed at other locations along the perimeter of ledge 22, and multiple channels could be formed to allow flow of adhesive sealant 50 down to bottom surface 24.

With the simultaneous sealing process of the present embodiment, any of the above-described housing structures 16-16″ may also be formed without covering the area of interposer 2 underlying chip cavity 20. In this manner, package formation is simplified because there is no requirement to wire bond within apertures 26 or to carry out additional operations to fill them with conductive material 54. Once image sensor chip 40 is mounted and electrically connected to interposer 2, adhesive sealant 50 covers any areas not sealed by the housing structures 16-16".

Although the present invention has been depicted and described with respect to the illustrated embodiments, various additions, deletions and modifications are contemplated within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. An electronic device, comprising:
   a package structure having a top surface and an opposing, bottom surface, a cavity in the package structure including a die mounting surface and an upwardly extending sidewall from the die mounting surface to the top surface of the package structure, the sidewall having at least a portion thereof oriented at an outward angle relative to the die mounting surface of greater than 90°;
   a semiconductor die located at the die mounting surface;
   an optically transparent lens located within the cavity and insulated from direct contact with the semiconductor die;
   at least one contact pad adjacent the die mounting surface located for electrical connection to the semiconductor die;
   at least one attachment pad on the bottom surface; and
   at least one conductive element passing through the package structure and electrically connecting the at least one contact pad and the at least one attachment pad.

2. The electronic device of claim 1, wherein the package structure comprises a dielectric.

3. The electronic device of claim 1, wherein the semiconductor die includes at least one bond pad, electrically connected to the at least one contact pad.

4. The electronic device of claim 3, wherein the at least one bond pad is electrically connected to the at least one contact pad by a connection selected from the group consisting of bond wires, solder, conductive epoxy, and conductor-filled epoxy.

5. The electronic device of claim 3, wherein the at least one bond pad is electrically connected to the at least one contact pad by a flip-chip connection.

6. A semiconductor device, comprising:
   a package structure having a die mounting area over a surface thereof within a cavity, the package structure further including a sidewall of the cavity extending above the surface and facing the die mounting area, at least a portion of the sidewall inclined at an outward angle of greater than about 90° relative to the surface;
   at least one contact pad exposed on an interior surface of the cavity;
   a semiconductor die in the die mounting area electrically connected to the at least one contact pad;
   at least one attachment pad exposed on a surface of the package structure other than the surface;
   at least one conductive structure passing through the package structure and electrically connecting the at least one contact pad and the at least one attachment pad; and
   an optically transparent lens within the cavity isolated from direct contact with the semiconductor die.

7. The semiconductor device of claim 6, wherein the package structure comprises a dielectric material.

8. The semiconductor device of claim 6, wherein the semiconductor die includes a plurality of bond pads, the at least one contact pad comprises a plurality of contact pads, and at least some of the bond pads of the plurality are electrically connected to contact pads of the plurality.

9. The semiconductor device of claim 8, wherein the at least some of the bond pads of the plurality are electrically connected to contact pads of the plurality by connections selected from the group consisting of bond wires, solder, conductive epoxy, or conductor-filled epoxy.

10. The semiconductor device of claim 8, wherein the at least some of the bond pads of the plurality are electrically connected to contact pads of the plurality by flip-chip connections.

11. A packaged semiconductor chip, comprising:
    a substrate structure having a first surface, an opposing, second surface, and a raised sidewall protruding above the first surface, extending along a perimeter of the substrate structure and defining a chip cavity, the raised sidewall comprising an upwardly facing, inclined surface surrounding the chip cavity;
    a semiconductor chip over the first surface within the chip cavity;
    a transparent lens element within the chip cavity, the transparent lens element insulated from contact with the semiconductor chip;
    at least one contact pad exposed adjacent the first surface and electrically connected to the semiconductor chip;
    at least one attachment pad exposed adjacent the second surface; and
    at least one conductive path electrically connecting the at least one contact pad to the at least one attachment pad through the substrate structure.

12. The packaged semiconductor chip of claim 11, wherein the substrate structure comprises a dielectric material at least adjacent to the at least one conductive path.

13. The packaged semiconductor chip of claim 11, wherein the semiconductor chip is electrically connected to the at least one contact pad by a flip-chip connection.

14. The packaged semiconductor chip of claim 11, wherein the semiconductor chip is electrically connected to the at least one contact pad by a connection selected from the group consisting of bond wires, solder, conductive epoxy, and conductor-filled epoxy.

15. The packaged semiconductor chip of claim 11, further comprising a material disposed over at least a portion of the upwardly facing, inclined surface.

16. A packaged electronic device, comprising:
    a structure having a first surface and including a sidewall surrounding the first surface to form a die cavity, the sidewall having at least a portion thereof oriented at an outward angle relative to the first surface of greater than about 90°;
    at least one contact pad adjacent the first surface;
    a semiconductor die located above the first surface within the die cavity and electrically connected to the at least one contact pad;
    an optically clear lens within the chip die extending over the semiconductor die and isolated from direct contact with the semiconductor die;
    at least one attachment pad adjacent another surface of the structure; and
    at least one conductor passing through the structure and electrically connecting the at least one contact pad and the at least one attachment pad.

17. The packaged electronic device of claim 16, wherein the structure comprises a dielectric material.

18. A chip package, comprising:
- a substrate structure having a chip mounting surface, an opposing surface, and a raised sidewall protruding above the chip mounting surface, extending along a perimeter of the substrate structure and bounding a chip cavity, the raised sidewall comprising an upwardly facing, inclined surface adjacent to the chip cavity;
- at least one contact pad exposed adjacent the chip mounting surface;
- a semiconductor chip disposed in the chip cavity and electrically connected to the at least one contact pad;
- a transparent cover having a optical focusing structure extending over the semiconductor chip within the chip cavity and out of contact with the semiconductor chip;
- at least one attachment pad exposed adjacent the opposing surface; and
- at least one conductive path electrically connecting the at least one contact pad to the at least one attachment pad through the substrate structure.

19. The chip package of claim 18, wherein the substrate structure comprises a dielectric.

20. The chip package of claim 18, wherein the semiconductor chip is electrically connected to the at least one contact pad by an intermediate conductive element.

* * * * *